(12) United States Patent
Sathik et al.

(10) Patent No.: US 10,605,854 B2
(45) Date of Patent: Mar. 31, 2020

(54) METHOD FOR ESTIMATING POWER SYSTEM HEALTH

(71) Applicant: ROLLS-ROYCE plc, London (GB)

(72) Inventors: Mohamed Halick Mohamed Sathik, Singapore (SG); Chandana Jayamapathi Gajanayake, Singapore (SG); Shantha Dharmasiri Gamini Jayasinghe, Singapore (SG); Amit Kumar Gupta, Singapore (SG); Rejeki Simanjorang, Singapore (SG)

(73) Assignee: ROLLYS-ROYCE plc, London (GB)

( * ) Notice: Subject to any disclaimer, the term of this patent is extended or adjusted under 35 U.S.C. 154(b) by 276 days.

(21) Appl. No.: 15/596,878

(22) Filed: May 16, 2017

(65) Prior Publication Data

US 2017/0350934 A1    Dec. 7, 2017

(30) Foreign Application Priority Data

Jun. 7, 2016 (GB) .................................. 1609907.9

(51) Int. Cl.
*G01R 31/26* (2020.01)
*G01R 31/327* (2006.01)
(Continued)

(52) U.S. Cl.
CPC ..... *G01R 31/2617* (2013.01); *G01R 31/2621* (2013.01); *G01R 31/327* (2013.01);
(Continued)

(58) Field of Classification Search
CPC .. G01R 27/16; G01R 31/025; G01R 31/3275; G01R 31/2617; G01R 31/2637; G01R 31/2644
See application file for complete search history.

(56) References Cited

U.S. PATENT DOCUMENTS 7,826,985 B2 * 11/2010 Weiss ..................... H02P 27/00
702/42
8,103,463 B2    1/2012 Kalgren et al.
(Continued)

FOREIGN PATENT DOCUMENTS

CN    202903960 U    4/2013
GB    2532215 A    5/2016
(Continued)

OTHER PUBLICATIONS

Oct. 27, 2016 Search Report issued in British Patent Application No. 1609907.9.
(Continued)

*Primary Examiner* — Alesa Allgood
(74) *Attorney, Agent, or Firm* — Oliff PLC

(57) ABSTRACT

A method of monitoring the health of a semiconductor power electronic switch such as an insulated gate bipolar transistor (IGBT) is provided. The method having the steps of: measuring one or more parameters selected from the group consisting of: a rate of change of voltage $$\left(\frac{dV}{dt}\right)$$

across the switch; a rate of change of current $$\left(\frac{di}{dt}\right)$$

through the switch, a charge present on a gate of the switch ($Q_G$), a peak overshoot voltage ($V_{PO}$) across the switch, and
(Continued)

a peak overshoot or reverse recovery current ($I_{RR}$) through the switch; and estimating the health of the switch based on the measured parameter(s).

15 Claims, 17 Drawing Sheets

(51) Int. Cl.
　　*H02M 3/158* (2006.01)
　　*H02M 7/217* (2006.01)
　　*H02M 7/537* (2006.01)
　　*G01R 31/40* (2020.01)

(52) U.S. Cl.
　　CPC ........... *H02M 3/158* (2013.01); *H02M 7/217* (2013.01); *H02M 7/537* (2013.01); *G01R 31/2637* (2013.01); *G01R 31/40* (2013.01)

(56) References Cited

U.S. PATENT DOCUMENTS

| | | | |
|---|---|---|---|
| 2007/0040571 A1 | 2/2007 | Dolian | |
| 2009/0276165 A1* | 11/2009 | Weiss | H02P 27/00 702/34 |
| 2013/0177041 A1 | 7/2013 | Sundaramoorthy et al. | |
| 2013/0328596 A1* | 12/2013 | Zoels | H03K 17/18 327/109 |
| 2014/0103937 A1 | 4/2014 | Khan et al. | |
| 2015/0193595 A1* | 7/2015 | McNamara | G16H 15/00 705/2 |
| 2015/0346242 A1 | 12/2015 | Meng et al. | |

FOREIGN PATENT DOCUMENTS

| | | |
|---|---|---|
| WO | 2013/093408 A1 | 6/2013 |
| WO | 2015/044205 A1 | 4/2015 |

OTHER PUBLICATIONS

Lobsiger., "Closed-Loop IGBT Gate Drive and Current Balancing Concepts", Dissertation No. 22232, pp. 1-179, 2014.

Yang et al., "An Industry-Based Survey of Reliability in Power Electronic Converters", IEEE Transactions on Industry Applications, vol. 47, No. 3, pp. 1141-1451.

Alghassi et al., "Computationally Efficient, Real-Time, and Embeddable Prognostic Techniques for Power Electronics", IEEE Transactions on Power Electronics, vol. 30, No. 5, pp. 2623-2634, 2015.

Keller et al., "Aircraft Electrical Power Systems Prognostics and Health Management", IEEE Aerospace Conference Proceeding, vol. 1, pp. 1-11, 2006.

Fuchs., "Some Diagnosis Methods for Voltage Source Inverters in Variable Speed Drives with Induction Machines a Survey", Proc. 29th Annu. Conf. IEEE Ind. Electron. Soc., pp. 1378-1385, 2003.

Schmidt et al. "Impact of Absolute Junction Temperature on Power Cycling Lifetime", 15th European Conference on Power Electronics and Applications (EPE), pp. 1-10, 2013.

Sep. 12, 2017 Extended European Search Report issued in European Patent Application No. 17171253.2.

Yang et al., "An Industry-Based Survey of Reliability in Power Electronic Converters", IEEE Transactions on Industry Applications, vol. 47, No. 3, pp. 1141-1451, 2011.

\* cited by examiner

METHOD FOR ESTIMATING POWER SYSTEM HEALTH

FIELD OF THE INVENTION

The present invention relates to estimating the health of power conversion system components, and particularly the health of power electronics switches such as MOSFETs, SiC MOSFETs, and IGBTs which can be used, for example, in inverter/rectifier systems.

BACKGROUND

Power systems generally include power converting systems, for example inverter or rectifiers. These converters may be employed in safety critical applications such as starter generators, e-oil, e-fuel or electrical actuation systems in aero applications. In these applications, safety and reliability are of the utmost importance. They can also be used in the context of land and sea electrical/hybrid electric propulsion systems, as well as for industrial drives, solar and wind power conversion etc.

It is estimated that around 38% of the faults in the variable speed drives used in these sectors are due to failure of the power devices (F. W. Fuchs, "Some diagnosis methods for voltage source inverters in variable speed drives with induction machines a survey," in *Proc. 29$^{th}$ Annu. Conf. IEEE Ind. Electron. Soc.*, 2003, pp. 1378-1385). The reliability of the power devices has improved in the past decade, in terms of progressive designs and optimized use of materials. However for mission-critical applications such as aerospace the reliability of the power devices may not be satisfactory, particularly as these sectors are prone to unpredictable failure events (K. Keller, K. Swearingen, J. Sheehan, M. Bailey, J. Dunsdon, K. W. Przytula and B. Jordan, "Aircraft Electrical Power systems prognosis and Health Management", *IEEE Aerospace Conference Proceedings*, Big Sky, MT, March 2006). In particular, there is an increased risk of premature failure when the devices are operated in harsh conditions which accelerate the aging process of the devices. Moreover, in safety critical applications a premature failure could lead to complete shutdown and require expensive and unplanned maintenance. Therefore health monitoring of these devices can is desirable.

Previously, the health of power devices has been estimated based on the threshold voltage limit of the on-stage voltage of the IGBT (Ralf Schmidt, Felix Zeyss, and Uwe Scheuermann. Impact of absolute junction temperature on power cycling lifetime. 15th European Conference on Power Electronics and Applications (EPE), pages 1-10, 2013). Accelerated aging tests were performed to create thermal stress tests of the devices to induce latch-up failures, and in particular through increasing the maximum junction temperature of a given device by reducing its heat transfer capability (for example by removing the heat sink). The device was then subjected to high temperature cycling until the latch-up failure occurred. In parallel to this, the junction temperature of the device was estimated based on the power loss. The estimated junction temperature and temperature cycles were noted, and from these (and the measured threshold voltage limit) the remaining useful life (i.e. health) was estimated. Unfortunately, the variation of the threshold voltage during degradation of the device can be lost amongst signal noise. This method also requires measurements at the high voltage side, and therefore voltage clamping is required to measure the voltage accurately, which is undesirable.

Another approach for monitoring the health of power devices is based on the switching behaviour. It utilizes the changes in ringing behaviour during the commutation period of a power module. This requires measuring the voltage or current in the high voltage side of the inverter, and uses a bandpass filter to extract the high frequency ringing component. This approach relies on the fact that increase in the damping co-efficient and attenuation in high frequency ringing of voltage and current waveform occurs after ageing of the power modules.

SUMMARY

In a first aspect the invention provides a method of monitoring the health of a semiconductor power electronic switch having the steps of:
  measuring one or more parameters selected from the group consisting of: a rate of change of voltage $$\left(\frac{dV}{dt}\right)$$

across the switch; a rate of change of current $$\left(\frac{di}{dt}\right)$$

through the switch, a charge present on a gate of the switch ($Q_G$); a peak overshoot voltage ($V_{PO}$) across the switch; and a peak overshoot or reverse recovery current ($I_{RR}$) through the switch; and
  estimating the health of the switch based on the measured parameter(s).

The inventors have discovered that the health of semiconductor power electronic switches, e.g. MOSFETs, SIC MOSFETs and IGBTs can be characterised with respect to the parameters mentioned above. As is discussed below, these parameters demonstrate predicable trends as compared to the health of a semiconductor power electronic switch.

In a second aspect, the invention provides a power conversion system including:
  at least one semiconductor power electronic switch the switch having a gate driver; and
  a processor, connected to the switch;
  wherein the gate driver has one or more parameter measuring modules for measuring one or more respective parameters selected from the group consisting of: a rate of change of voltage $$\left(\frac{dV}{dt}\right)$$

across the switch, a rate of change of current $$\left(\frac{di}{dt}\right)$$

through the switch, a charge present on a gate of the switch ($Q_G$), a peak overshoot voltage ($V_{PO}$) across the switch, and a peak overshoot or reverse recovery current ($I_{RR}$) through the switch; and wherein the processor is configured to estimate the health of the switch based upon the measured parameter(s).

In yet another aspect, the invention provides a gate driver for a semiconductor power electronic switch, suitable to be installed in a power conversion system and having:

one or more parameter measuring modules for measuring one or more respective parameters selected from the group consisting of: a rate of change of voltage $$\left(\frac{dV}{dt}\right)$$

across the switch, a rate of change of current $$\left(\frac{di}{dt}\right)$$

through the switch, a charge present on a gate of the switch ($Q_G$), a peak overshoot voltage ($V_{PO}$), and a peak overshoot or reverse recovery current ($I_{RR}$); and an embedded processor configured to estimate the health of the switch based upon the measured parameter(s).

In another aspect, the invention provides a propulsion system including an electric drive, the electric drive being electrically connected to the power conversion system as set out in the second aspect. For example, this may be a marine propulsion system.

Optional features of the invention will now be set out. These are applicable singly or in any combination with any aspect of the invention.

The semiconductor power electronic switch may be selected from the group consisting of; a MOSFET (metal-oxide-semiconductor field-effect transistor), a SiC MOSFET, and an IGBT (insulated-gate bipolar transistor). Preferably the semiconductor power electronic switch is an IGBT. Preferably, the one or more parameters are selected from the group consisting of; the rate of change of voltage, the rate of change of current, and the charge present across the switch.

The estimated health can include an estimate of the remaining useful lifetime (RUL) of the switch.

In some examples, the health estimating step may include comparing the measured parameter(s) with respective predefined threshold value(s) of the parameter(s).

There may be a further step of estimating a junction temperature of the switch, and the health estimating step may include normalizing one or more of the measured parameter(s) with respect to the estimated junction temperature.

Just two, three or four parameters or all five parameters may be measured and then used to estimate the health of the switch. However, in some examples, just two or just three parameters may be measured in the measuring step; one of the measured parameters may then be used in the junction temperature estimating step to estimate the junction temperature; and the, or each, other measured parameter may be normalized in the health estimating step and used to estimate the health of the switch.

The measuring step and the health estimating step may be repeatedly performed at a sampling frequency, and the sampling frequency may be a function of the estimated health of the switch. For example, if the estimated health of the switch is poor, the sampling frequency may be increased so as to more closely track the decline of the switch.

The parameter(s) may be measured in the measuring step by respective embedded measuring circuit(s) of a gate driver of the switch.

The respective embedded measuring circuit for measuring the rate of change of voltage may include an external Miller capacitor connected to the collector terminal of the switch. The external Miller capacitor may be a figurative capacitor which is indicative of the parasitic capacitance due to the Miller effect within the switch. In this example, the voltage across the capacitor may be amplified and compared with a reference operating voltage limit, the output of the comparison corresponding to a pulse width which is used to estimate the rate of change of voltage.

The respective embedded measuring circuit for measuring the rate of change of current may be a current mirror circuit connected in parallel with a Kelvin emitter of the switch. In this example, a collector-current observed in the current mirror circuit may be compared with a reference operating current limit, the output of the comparison corresponding to a pulse width which is used to estimate the rate of change of current.

The respective embedded measuring circuit for the gate charge may be a charge pump connected to a gate of the switch. In this example, the charge pump may supply an approximately constant current $i_G$ to the gate of the switch, such that the gate charge can be calculated as: $Q_{G\#V_{GE}} = i_G \times \Delta T(V_{GE})$ wherein $\Delta T(V_{GE})$ is the time to achieve voltage $V_{GE}$ from an initial voltage.

The processor may be embedded into the gate driver. This may reduce the computational load on any health monitoring system connected to the gate drivers.

Alternatively, the processor may be external to the gate driver, and electrically connected thereto, This may reduce the size and weight of the gate driver.

When the peak overshoot voltage ($V_{PO}$) across the switch and the peak overshoot or reverse recovery current ($I_{RR}$) through the switch are measured, these may be derived (e.g. using the processor) from the measured rate of change of voltage $$\left(\frac{dV}{dt}\right)$$

and/or rate of change of current $$\left(\frac{di}{dt}\right).$$

Alternatively, the peak overshoot voltage ($V_{PO}$) and/or the peak overshoot or reverse recovery current ($I_{RR}$) may be measured using dedicated measuring circuit(s).

BRIEF DESCRIPTION OF THE DRAWINGS

Embodiments of the invention will now be described by way of example with reference to the accompanying drawings in which.

DETAILED DESCRIPTION AND FURTHER OPTIONAL FEATURES

In the description below, an IGBT (insulated gate bi-polar transistor) is considered. The skilled person will of course appreciate that the methods, circuits, and results discussed below are equally applicable (with any appropriate modification) to other semiconductor power electronic switches such as MOSFETs and SiC MOSFETs.

Figure 1:
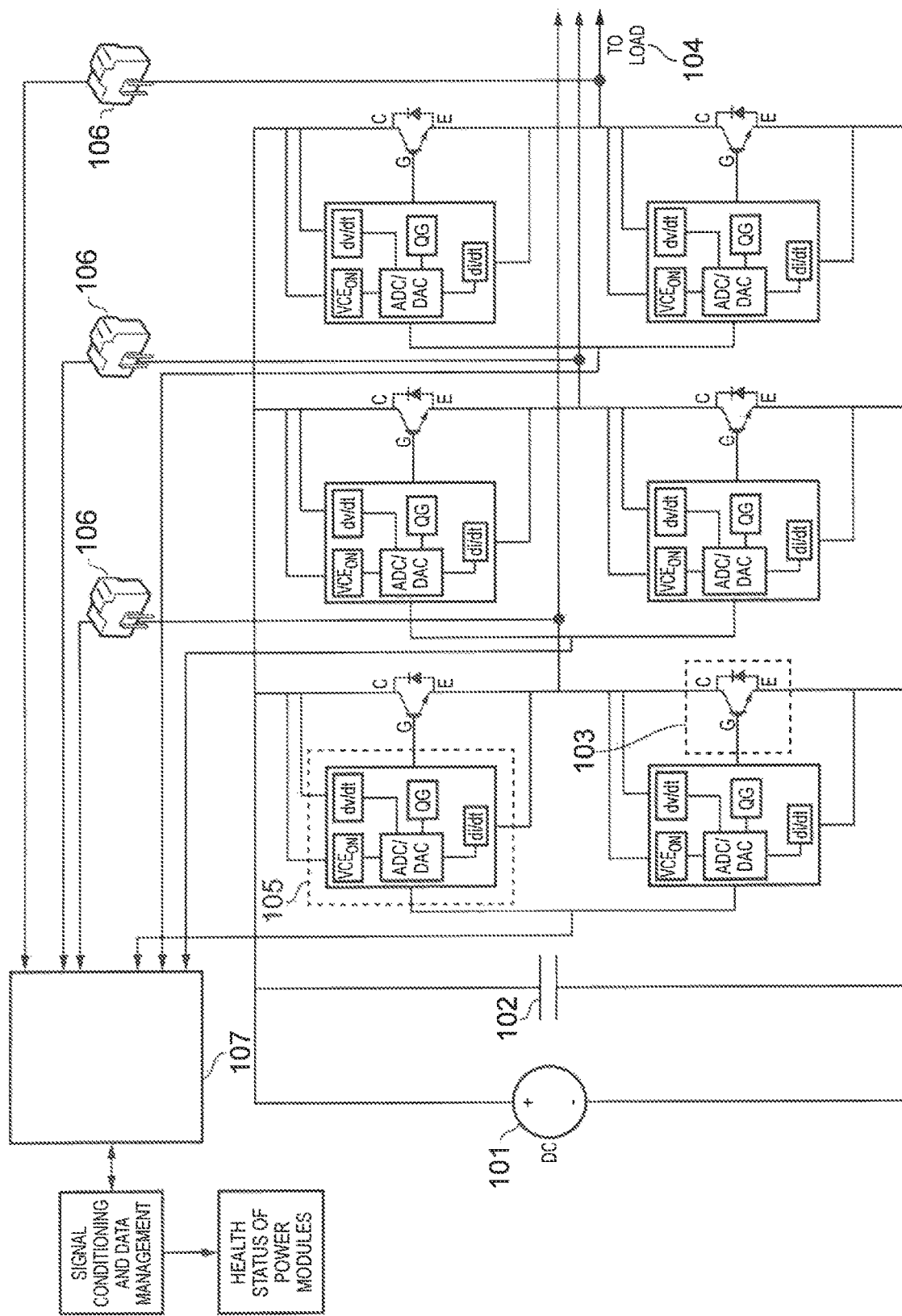
FIG. 1 shows a block diagram of a converter including a health prognosis system.

FIG. 1 is a block diagram of an example power converter (in this case an inverter) including a health prognosis system i.e. a system for monitoring the health of the power converter. A DC source 101 is connected via a capacitor 102 to a series of insulated gate bipolar transistors (IGBTs) 103, which are connected to a load 104. The IGBTs can be referred to as power converting devices. The IGBTs are switched such that the output current to the load is an AC current.

Connected to each IGBT is a gate driver 105, which includes an embedded health prognosis system. Each gate driver 105 includes a module for measuring: the gate charge $Q_G$, rate of change of voltage across the IGBT $$\frac{dV}{dt},$$

and rate of change of current $$\frac{di}{dt}.$$

The gate driver 105 may also include an analogue to digital converter and/or digital to analogue converter, as well as a module for directly measuring the voltage across the collector and emitter of the IGBT when it is switched on: $V_{CE_{ON}}$. At least some of the outputs of the IGBTs are connected to current sensors 106, and both the current sensors and gate drivers can be connected to a digital processor 107. The output of this digital processor may be subjected to signal conditioning and data management. The health status of the IGBTs may therefore be determined.

Here each power device (i.e. IGBT) can be monitored periodically, and any changes in the measured characteristics can be logged by the gate driver or by a central management computer. A gate driver with the capabilities discussed above can be referred to as a gate driver with embedded prognosis capability (GDEPC). The GDEPC can transmit the observed variation to a processing system such as the digital processor, which can allow the device health status to be determined and analysed. Alternatively the device health status can be determined by a processor embedded in the gate driver. The digital processor, either external or embedded, can intelligently manage the data acquisition from the GDEPCs and communicate with a converter system controller to enable the derivation of the system level health status and also a remaining useful lifetime (RUL) estimation for the system. The system level health indication and RUL estimation of the system can either be done in the digital processor connected to each converter or at a separate dedicated processor responsible for monitoring the health of the converter. This separate dedicated processor can derive the RUL and system health of the entire converter by considering the individual component health, RUL status, and expected usage profiles.

Figure 2:
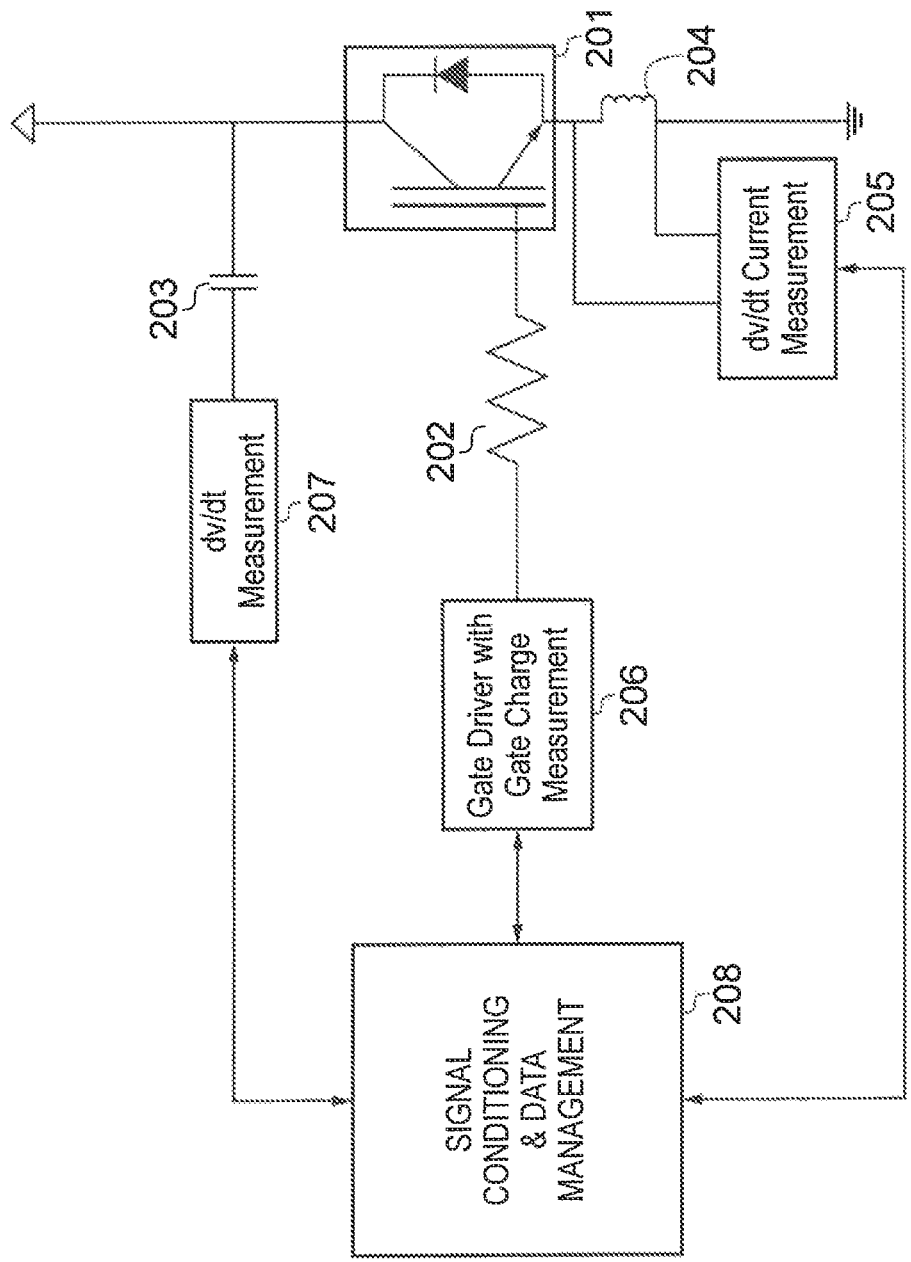
FIG. 2 shows a schematic of a gate driver with embedded prognostic capability.
Figure 3A:
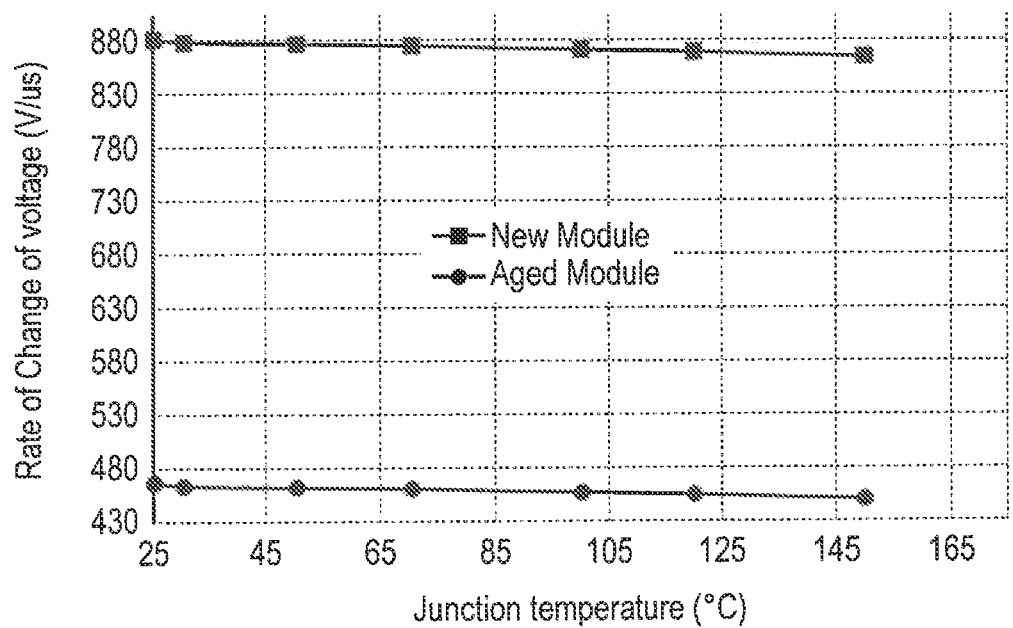
FIGS. 3A-3D are plots showing the variation of certain parameters with respect to junction temperature for both aged and new devices.
Figure 3B:
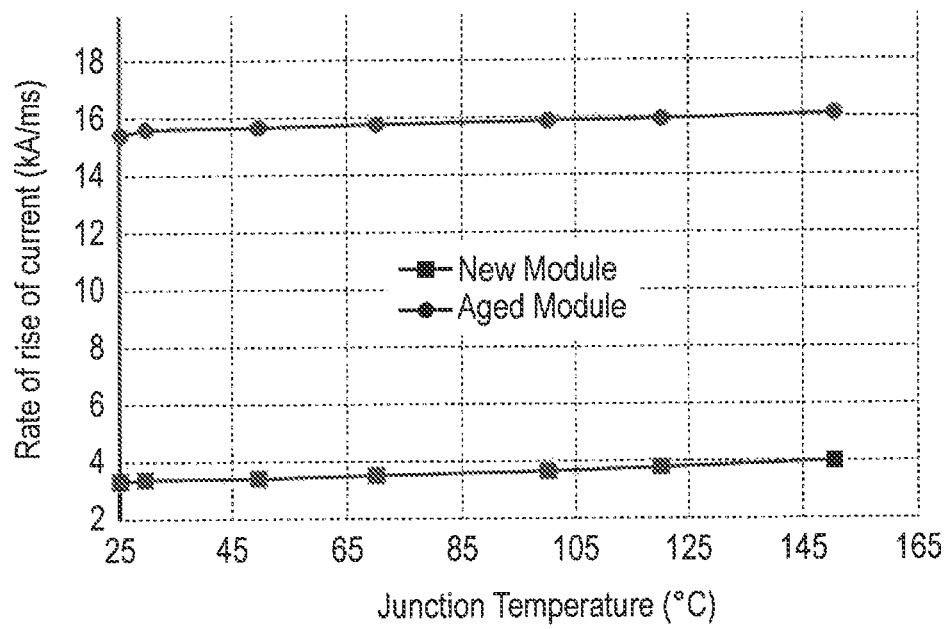
Figure 3C:
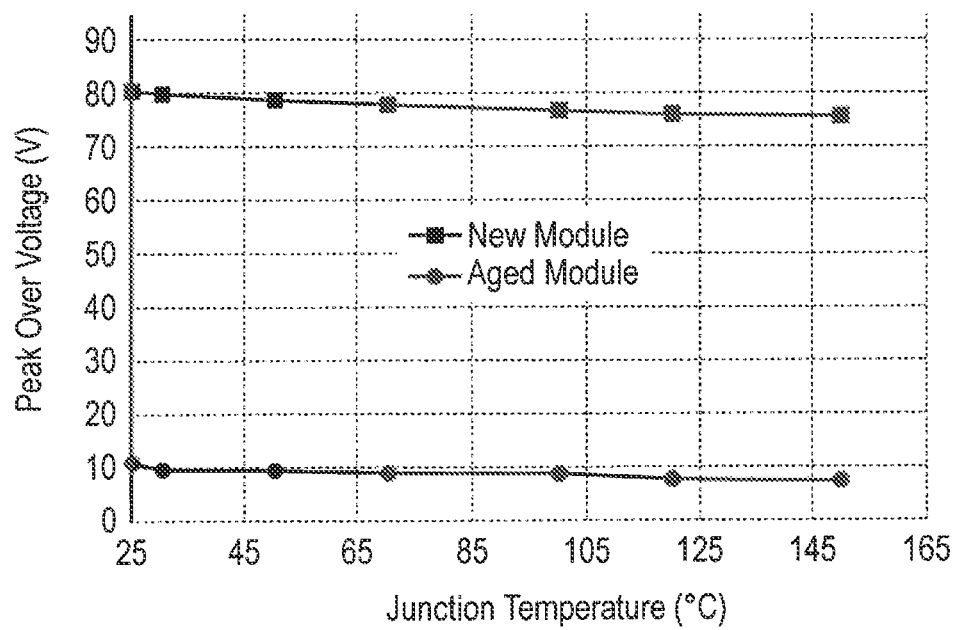
Figure 3D:
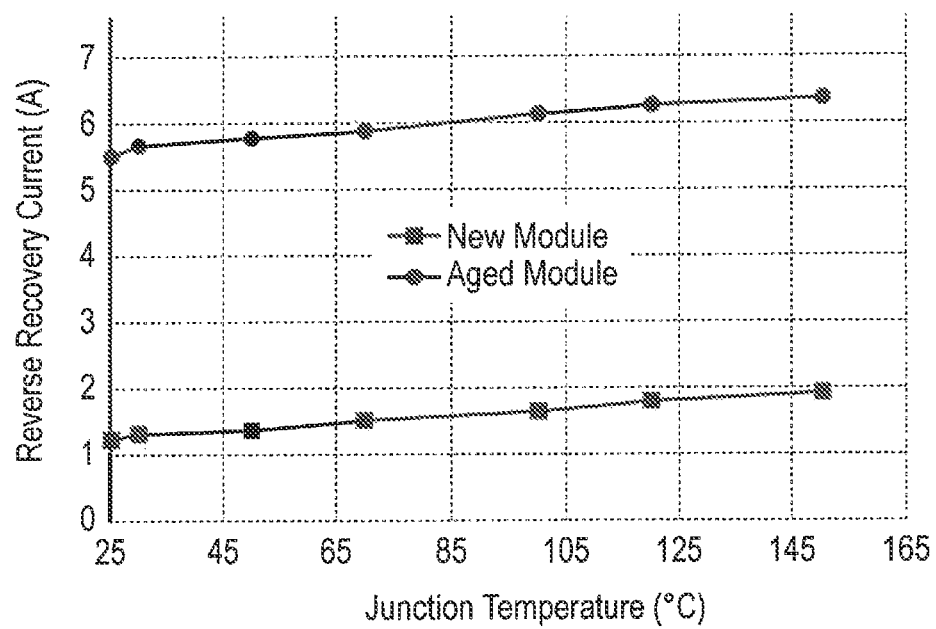

FIG. 2 shows in more detail a gate driver with embedded prognostic capability (GDEPC). The GDEPC manages the switching time, isolation, and other basic functions needed to operate an IGBT 201 as well as measuring the electrical parameters needed to detect the ageing (i.e. deterioration in health) of the power module, The term 'ageing' can be considered to define a degradation process that leaves the device operating in an un-safe mode i.e. it is unhealthy. The GDEPC primarily detects the ageing of power modules due to temperature and power cycling, and does so by measuring one or more of the following parameters: the gate charge $Q_G$, rate of change of voltage across the IGBT $$\frac{dV}{dt},$$

and rate of change of current $$\frac{di}{dt}.$$

It may do so by provision of: a Miller capacitor 203 connected to a $\frac{dV}{dt}$ module 207, a gate resistor 202 connected to a gate driver with gate charge $Q_G$ measurement module 206, and a $\frac{di}{dt}$ measurement module 205 connected to a Kelvin emitter 204. The Kelvin emitter 204 is connected in series with the emitter terminal of the IGBT 201.

Generally the rate of change of current, rate of change of voltage, and gate charge measurements require high bandwidth sensors. This would be expensive and difficult to implement as an integral part of the converter. Therefore measurement circuits may be implemented in the gate drive of each IGBT to measure each of these parameters. In addition to the three parameters discussed above, it is also possible to determine the peak overshoot voltage and peak overshoot or reverse recovery current from the circuits used to measure $\frac{dV}{dt}$ and $\frac{di}{dt}$ respectively. Alternatively, as will be appreciated by one skilled in the art, separate circuits can be provided to directly measure the peak overshoot voltage and/or the peak overshoot or reverse recovery current.

In general, the derivation of the health status of the devices may have two components, The first monitors the abovementioned parameters to detect any significant change in the most recently measured parameters as compared to historically measured parameters. The second, based upon the most recently measured parameters, specifies the current operating condition of the system.

The health status of the device can be determined by observing the magnitude of the abovementioned parameters. For example the value of these observed parameters can be compared with pre-defined threshold values that indicate the health condition of the device. A look-up table can be provided in the GDEPC which enables the GDEPC to ascertain the health condition of the device. The data in the look-up table can be obtained by performing accelerated aging tests on representative examples of the device (e.g. IGBTs of the same or similar specification).

A problem in the use of these parameters to indicate the health of power devices can be their dependency on the age of the device as well as the current operating conditions (such as junction temperature). Therefore in some circumstances unprocessed measurements of the parameters may not be suitable for prognostic indicators, and may require normalizing. In some examples, an electro-thermal model is used in a processor embedded in the gate drive to normalise the parameters. In such examples, all the measured prognostic indicators can be normalised with respect to variation in temperature. It is also possible to normalise the parameters with respect to the device operating current as well.

FIGS. 3A-3D show the dependency of the parameters for both new/healthy and aged/unhealthy modules (i.e. components) on junction temperature. As can be seen in all of the plots, the rate of change of the respective parameter with temperature is approximately the same for both new and aged modules. For example, as is clear from FIG. 3A, the rate of change of voltage decreases with increasing junction temperature for both old and new components. The same applied for FIGS. 3B-3D and their respective parameters.

Another potential problem may arise from the fact that the power devices (i.e. IGBTs) may be switched incredibly fast, for example in the range of megahertz. Therefore the amount of measurement data could be very high and, accordingly, difficult to manage. The use of an embedded processor in the gate driver can enable the triggering of data capture which may facilitate data management. The sampling frequency (i.e. the rate at which data capture is triggered) can be varied based upon the health status of the component, as shown in flow diagram in FIG. 4. Here 'x' represents the number of cycles that should have occurred before measurement is to take place. x can be varied in light of the comparison between the normalised measurements and the pre-defined thresholds.

Figure 4:
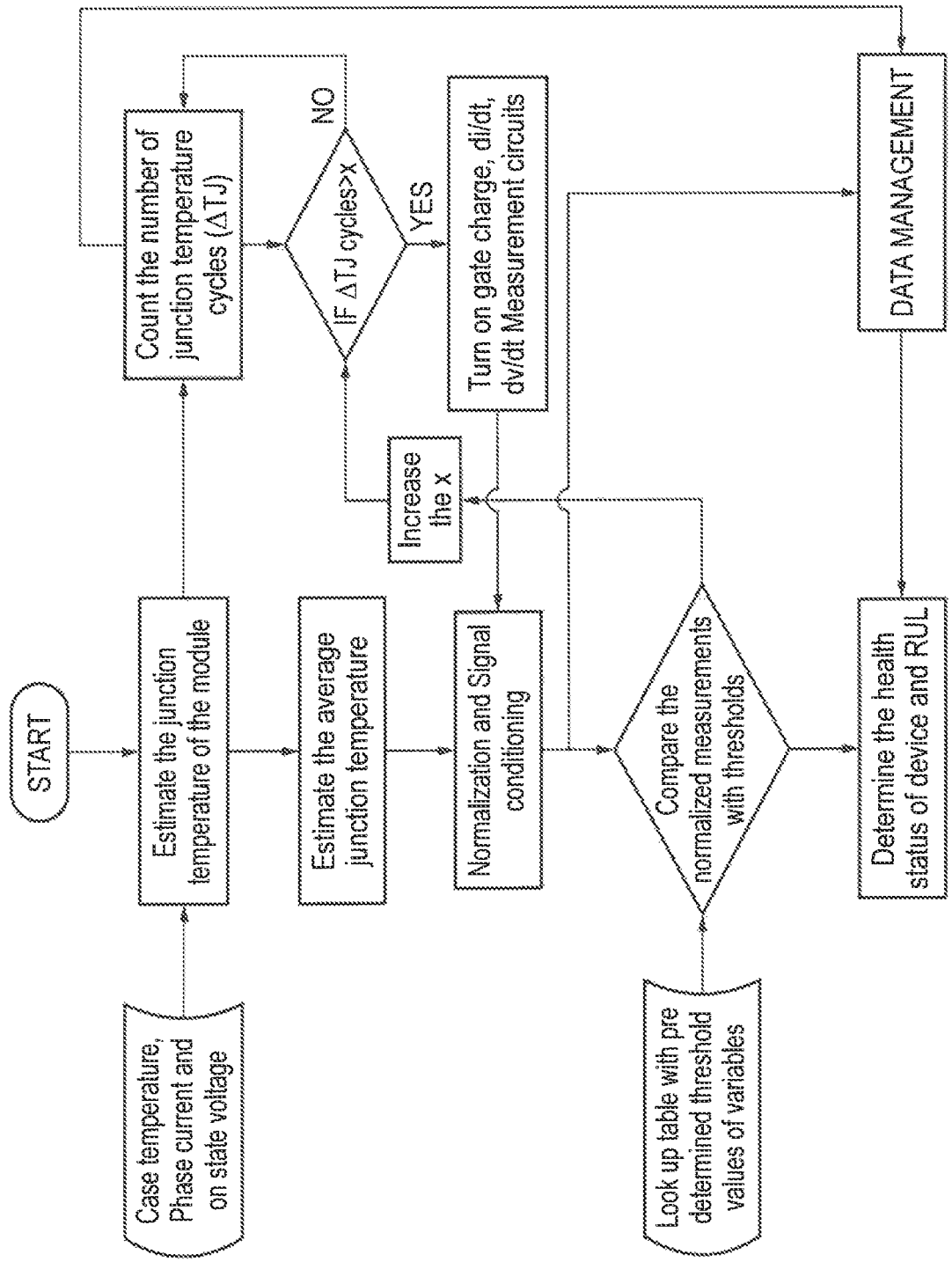
FIG. 4 shows a flow chart of the inverter prognosis system.

As is also shown in FIG. 4, the case temperature and phase current of the device can be used to estimate the junction temperature using a compact thermal model. From the estimated junction temperature, a number of temperature cycles can be counted using a rain flow algorithm. When the temperature cycle counts reach a predetermined number of cycles 'x', the controller sends an enabling signal to trigger the collection of the various parameters. The measured parameters can then be normalised and compared with previously observed parameters. If any changes are detected a signal can be transmitted which is indicative of the health status of the device. The number of cycles that can be used for sampling the data can be linear or it can be changed considering the health status of the device to improve the accuracy of the RUL estimation. For example more samples can be taken when the device is near the end of its RUL.

Figure 5:
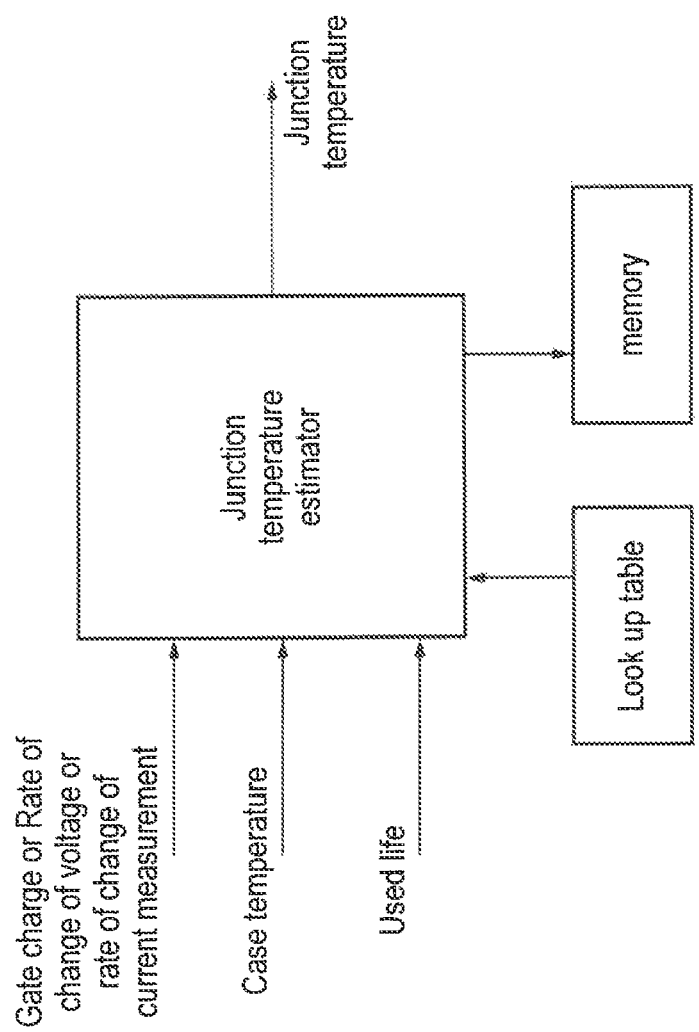
FIG. 5 shows a control schematic of a junction temperature estimator.

FIG. 5 is a block schematic of a junction temperature estimation method. Any one of the three measured parameters can be taken as inputs together with or instead of the case temperature and used life. A look-up table can then be used to estimate the junction temperature, and the estimated value stored in memory.

Figure 6:
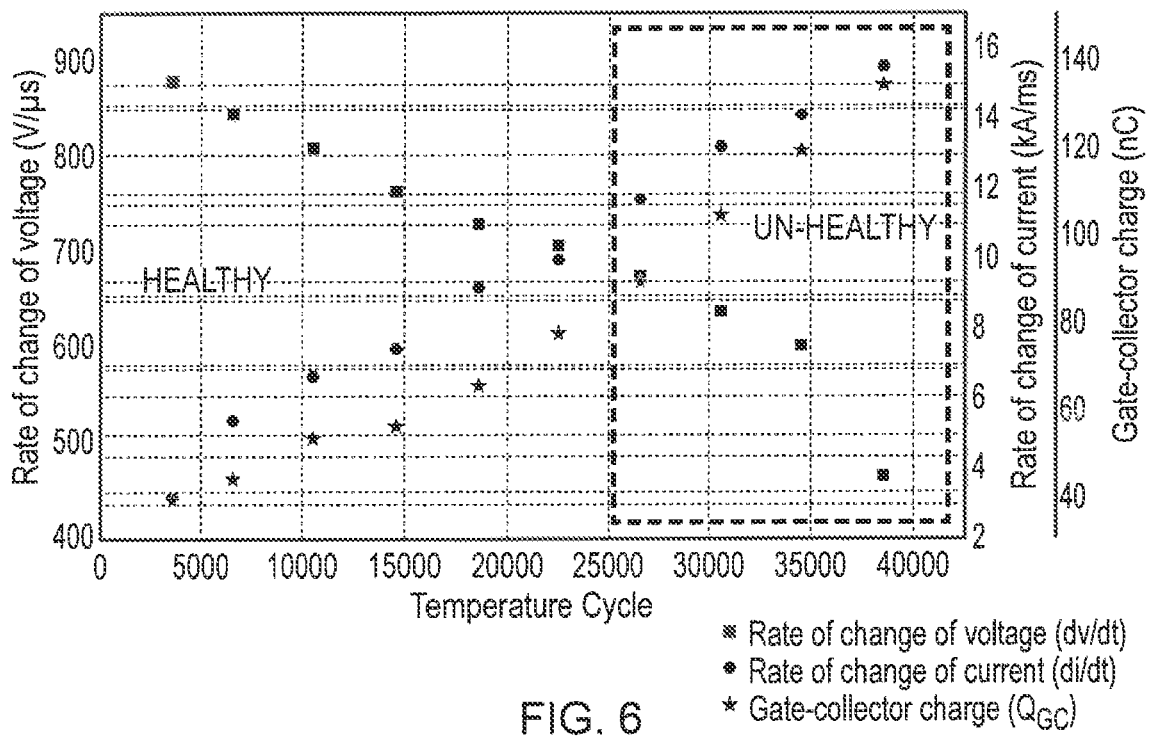
FIG. 6 is a plot showing the dependence of three parameters with temperature cycle.
Figure 7:
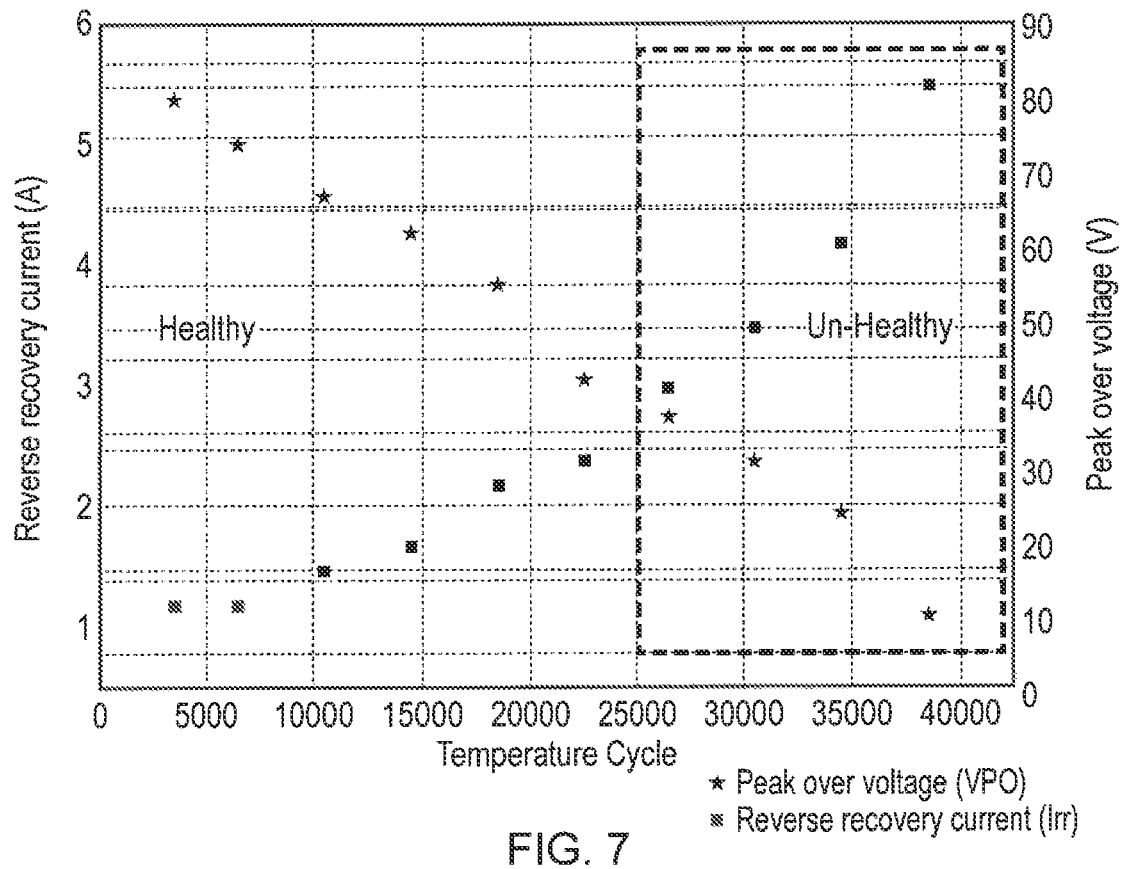
FIG. 7 is a plot showing the dependence of two other parameters with temperature cycle.

The three parameters are able to be used to estimate the health of a component due to their predicable behaviour with respect to the number of cycles (i.e. the age of the component). This is shown in FIG. 6, which is a plot of the three parameters: rate of change of voltage, rate of change of current, and gate charge as a function of temperature cycle. In the beginning (i.e. at low temperature cycle values) the parameters show small changes. However once the temperature cycle value surpasses 20,000 cycles there are significant changes in comparison to the previously observed values and the observed values indicate that the device is no longer healthy. In this ageing characteristics curve, pre-selected threshold values are stored and used as health indicators and also to calculate the used life as well as the remaining useful life. It is also possible to use a particle filter to predict the remaining life by considering variations in the parameters towards pre-defined threshold values. FIG. 7 is a similar plot but indicating the dependence of peak over voltage $V_{PO}$ and reverse recovery current $I_{RR}$ with respect to temperature cycle value.

The three parameters in FIG. 6 can be measured utilizing simple circuits which are embedded with the gate driver. In principle, only one or just two of the parameters can be measured, but a more accurate estimate of the health of the IGBT can be obtained by measuring all three.

Figure 8:
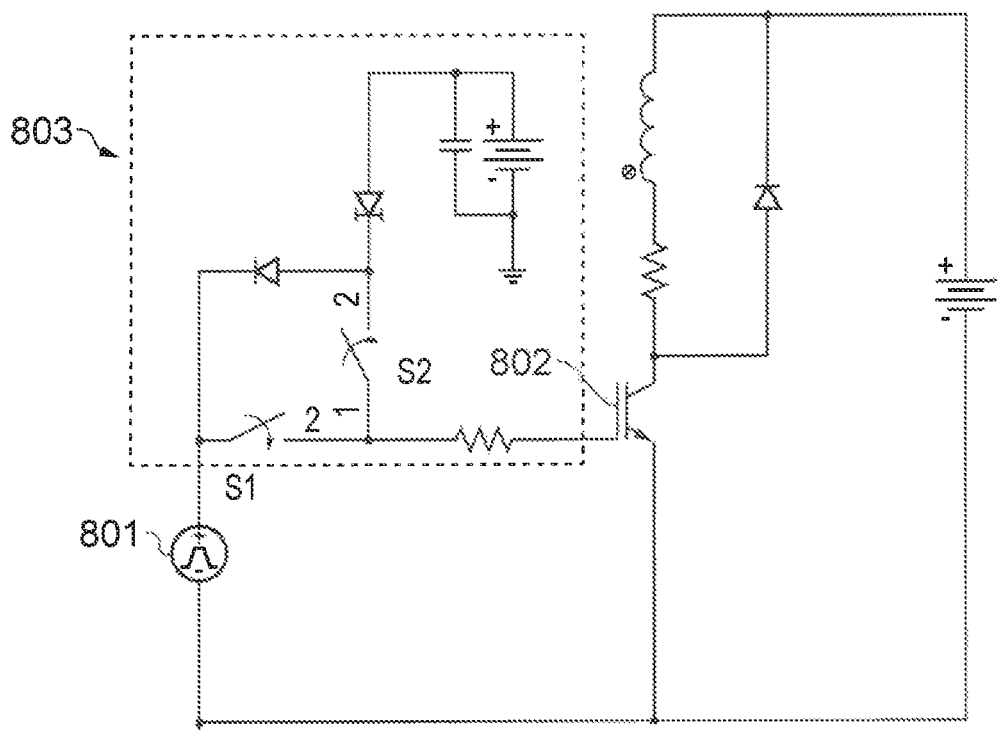
FIG. 8 is a diagram showing a gate charge measurement circuit as connected to an IGBT.
Figure 9:
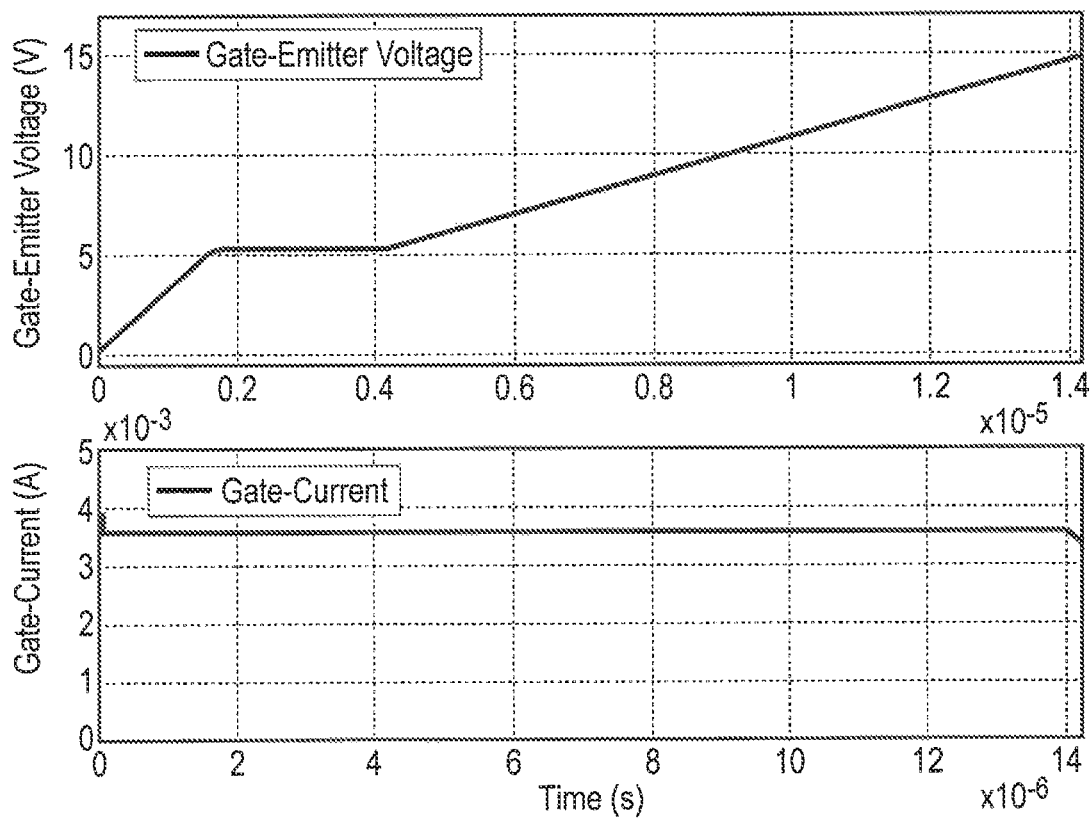
FIG. 9 contains two plots of gate-emitter voltage and gate-current against time.

FIG. 8 shows a test circuit 803 suitable to measure the gate charge on an IGBT 802. The IGBT is controlled by voltage source 801. In this circuit, an approximately constant current (shown in FIG. 9) is supplied to the gate of the IGBT from two switches s1, s2 and two current diodes. During normal operating conditions, switch s1 is closed and s2 is open. When gate charge is to be measured, switch s2 is closed and switch s1 opened. The net measurement of the charge consumed by the gate is relative to a given current and voltage in the gate-to-emitter path (where $i_G$ is the approximately constant current and $\Delta T(V_{GE})$ is the time required to achieve the given voltage $V_{GE}$ from an initial voltage):

$$Q_{G\#V_{GE}} = i_G \times \Delta T(V_{GE}) \quad (1)$$

The gate charge at a particular gate voltage is the product of the gate charge with respect to the time required to achieve that particular gate voltage from an initial voltage value. The gate-emitter voltage $V_{GE}$ and the gate current $i_G$ are shown by the plots in FIG. 9.

Figure 10:
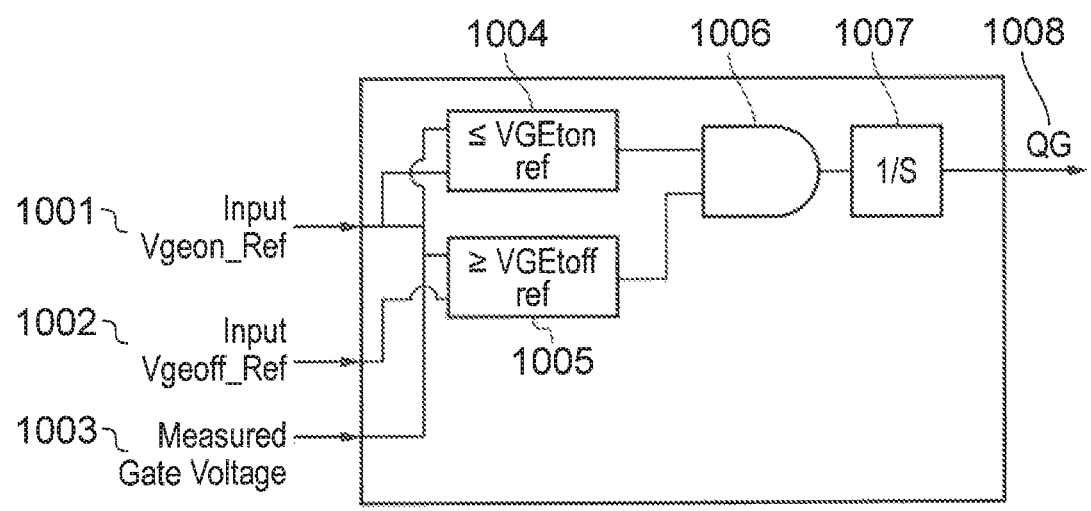
FIG. 10 is a diagram showing the process for extracting the gate charge from the measured gate-emitter voltage under constant gate current.

FIG. 10 is a circuit which can be used to extract a value for the gate charge from the measured gate-emitter voltage under a constant gate current. The measured gate-emitter voltage 1003 is compared 1007 with an input voltage reference which is either an on state voltage 1001 or off state voltage 1002. In some examples this is assumed to be 15V for an on state, and −5V or 0V for an off state. The output of the comparator generates a logic pulse which enables an integrator 1007 to estimate the gate charge 1008 of the device.

Figure 11:
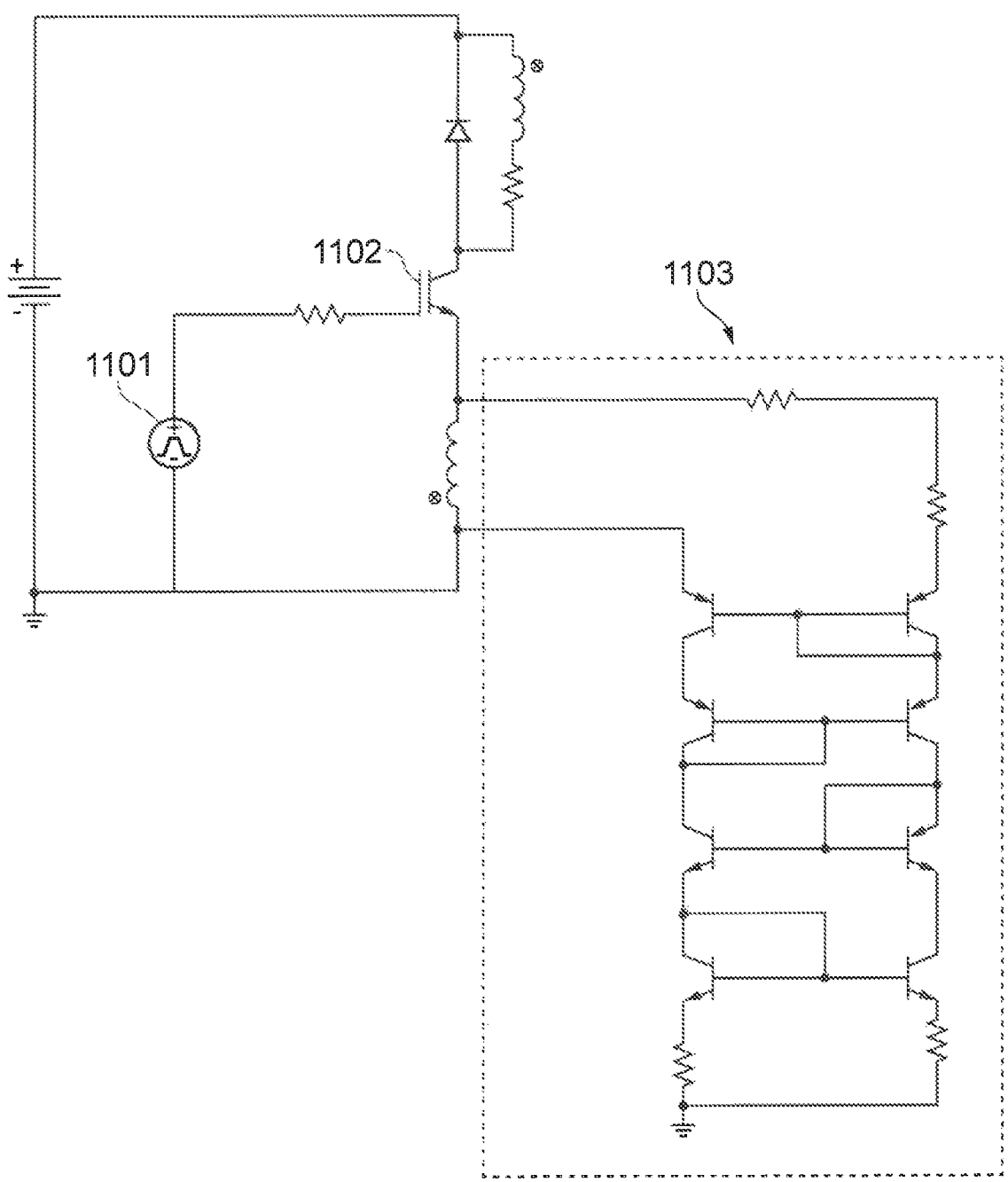
FIG. 11 is a diagram showing a rate of change of current measure en circuit as connected to an IGBT.

Similarly, the rate of change of current can be estimated using the circuit shown in FIG. 11. When a power device, such as an IGBT, is forward biased and is turned on by a gate pulse, the collector current will start rising and reach a steady state value in the immediate neighbourhood of the gate to the emitter junction. A minimum time is required for the device to spread the current conduction consistently through the conduction channel. However the current can spread across the whole area of the junction which may surpass the transistor design limits. Due to the rate of increase in collector current, local hot spots can be formed close to the gate connection. These local hot spots can destroy the transistor. Therefore this rate of increase of current is an important factor for analysing the deterioration in health of an IGBT. It could be measured directly by the current sensor 106, however this would require a very high bandwidth current sensor and associated controller. As an alternative, the rate of change of current can also be determined by using the rising time $t_r$ (where $I_C$ is the current through the collector):

$$\frac{dI_c}{dt} = \frac{0.8 \times I_C}{t_r} \quad (2)$$

The sub-circuit 1103 shown in FIG. 11 is a current mirror connected across a sensing resistor parallel to the IGBT's 1102 Kelvin emitter, where the IGBT 1102 is controlled by voltage source 1101. If the IGBT 1102 is lacking a Kelvin emitter terminal, an emitter can be connected with a small inductance to ground in order to measure the rate of change of current.

Figure 12:
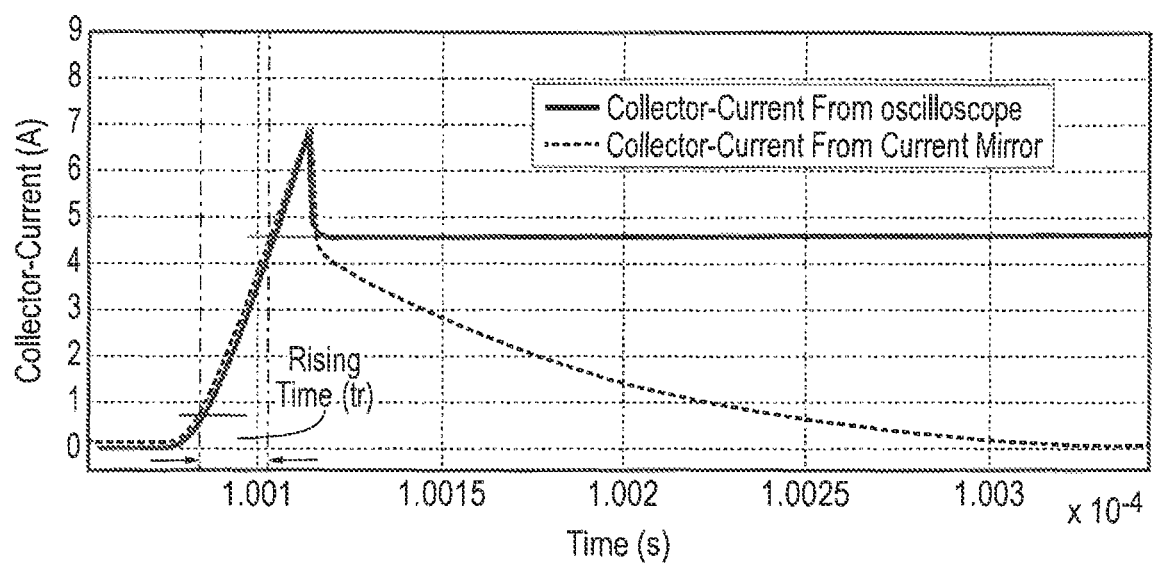
FIG. 12 is a plot of collector-current from an oscilloscope and collector-current from a current mirror against time.

FIG. 12 shows two waveforms: the collector current as measured in a simulation of the IGBT, and the collector current as measured in a simulation of the current mirror connected to the simulated IGBT. This plot shows that the error between the measured current using the oscilloscope and the current mirror is very small over the applicable regime (during the switch-on period). Therefore the current measured from the current mirror can be used as a representative value of the actual collector current through the IGBT over the applicable regime.

Figure 13:
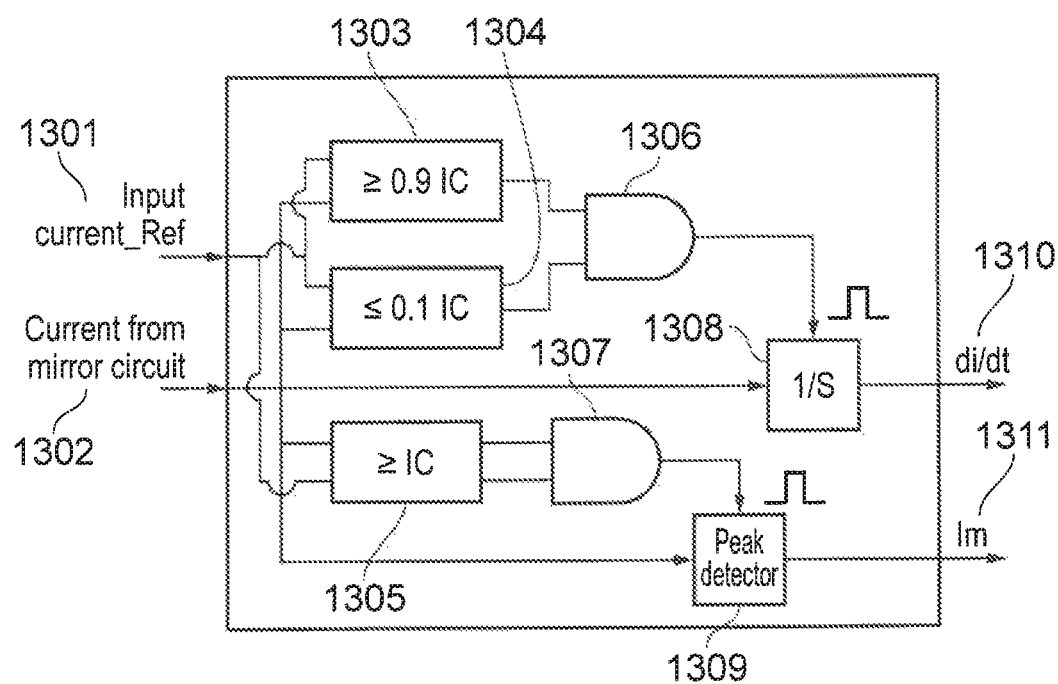
FIG. 13 is a diagram showing the process for extracting the rate of change of current from the current mirror input.

FIG. 13 is a circuit which can be used to estimate the rate of change of current 1310 from the current mirror output 1302. As with FIG. 10, the input 1302 is compared 1306 to a reference value 1301 which in this case is the reference operating current limit 1301. The output of the comparator 1306 is a pulse with a modified pulse width which allows an integrator 1308 to estimate the value of the rate of change of current 1310. Similarly, a peak detector 1309 can be used to estimate the reverse recovery current $I_{rr}$ of the device.

Figure 14:
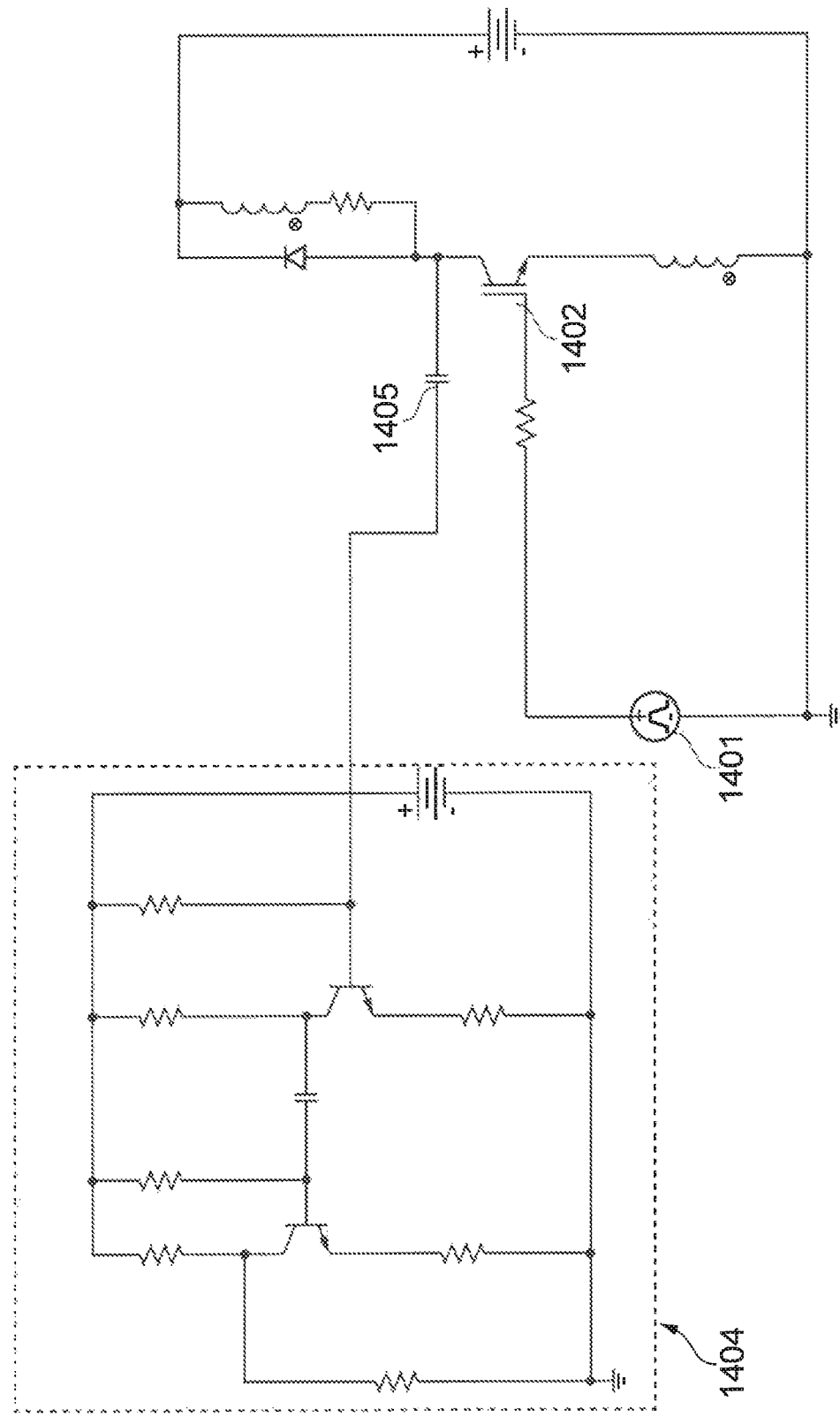
FIG. 14 is a diagram showing a rate of change of voltage measurement circuit as connected to an IGBT.

As with the two previous parameters, the rate of change of voltage can be measured through the use of a sub-circuit 1404 as shown in FIG. 14. When a forward voltage is applied across the collector and emitter of a transistor, the outer junction of the transistor is forward biased and the inner junction is reverse biased due to the space-charges exiting the depletion region. Therefore it behaves like a capacitance, as illustrated by Miller capacitor 1405, and induces a potential stress across the IGBT module.

The rate of change of voltage can be determined by using a falling time $t_f$ and a turn off time $t_{doff}$:

$$\frac{dv_{CE}}{dt} = \frac{0.9 \times v_{CE}}{t_{doff}} \quad (3)$$

This can be measured by the circuit shown in FIG. 14, where an external Miller capacitor 1405 (which represents the Miller effect) is connected in series with the collector terminal of the IGBT 1402 (the IGBT being controlled by a voltage source 1401). The output of the capacitor 1405 is amplified using an amplifier.

Figure 15:
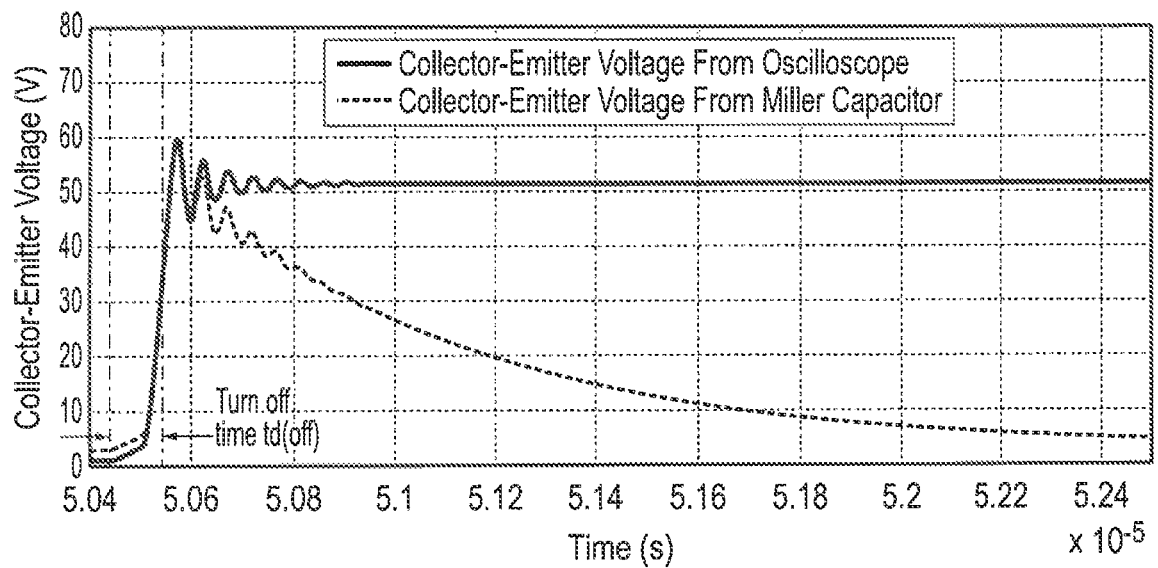
FIG. 15 is a plot of collector-emitter voltage from an oscilloscope and collector-emitter voltage from a miller capacitor against time.

FIG. 15 shows the results of a simulation which directly measured the rate of change of collector-emitter voltage as compared to the collector-emitter voltage measured from the external Miller capacitor 1405. This plot shows that over the relevant regime (switch-off) the rate of change of the voltage measured over the external Miller capacitor 1405 is very similar to the directly measured rate of change of collector-emitter voltage. Therefore the rate of change of voltage measured over the external Miller capacitor 1405 can be used as a representative value of the actual rate of change of collector-emitter voltage over the applicable regime.

Figure 16:
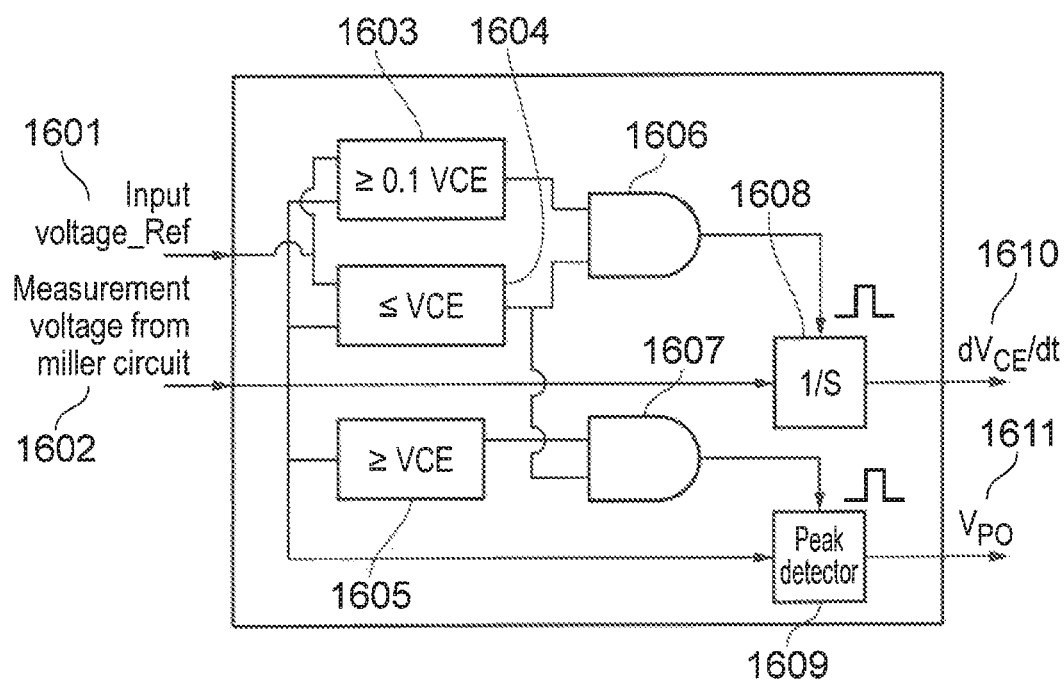
FIG. 16 is a diagram showing the process for extracting the rate of change of voltage from an external miller capacitor circuit.

The rate of change of voltage can then be estimated using the circuit shown in FIG. 16, which takes as its inputs the measurement voltage from the Miller circuit 1602 and an input voltage reference 1601. The values are compared 1606 and the output is a pulse with a modified pulse width. This output can be used by an integrator 1608 to estimate the rate of change of voltage 1610. A peak detector 1609 can also be used to extract the off-state overshoot voltage ($V_{PO}$) 1611 of the device.

Figure 17:
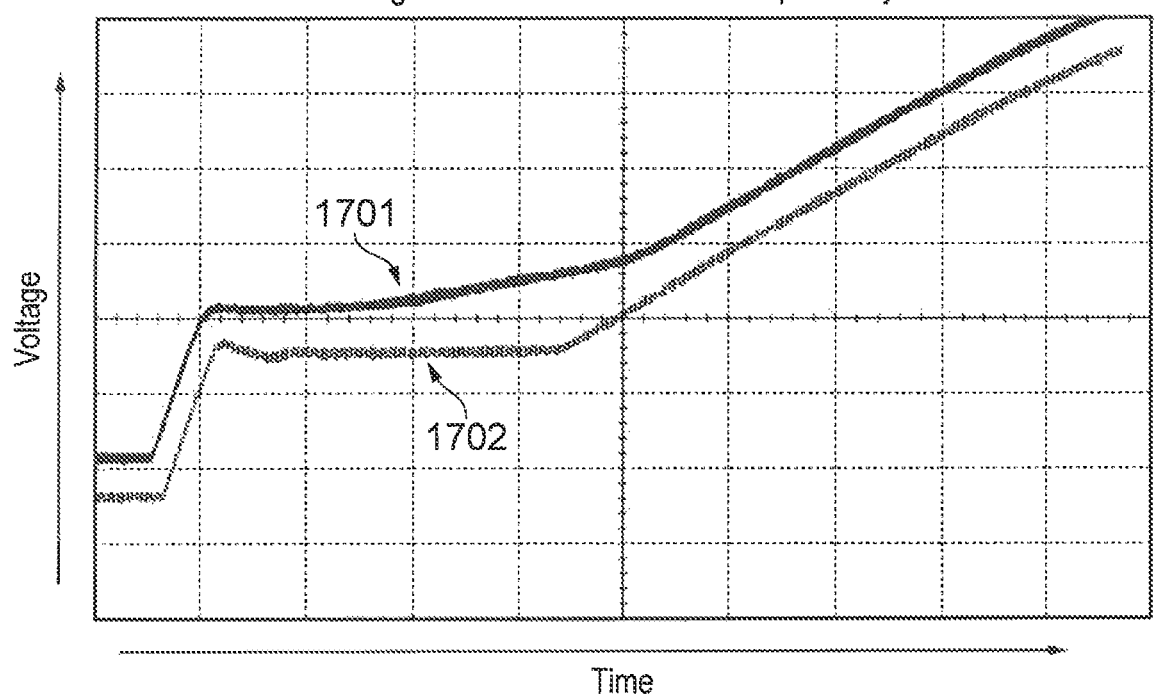
FIG. 17 is a plot of voltage against time for an IGBT before and after power cycle testing, illustrating the change in gate charge characteristics.
Figure 18:
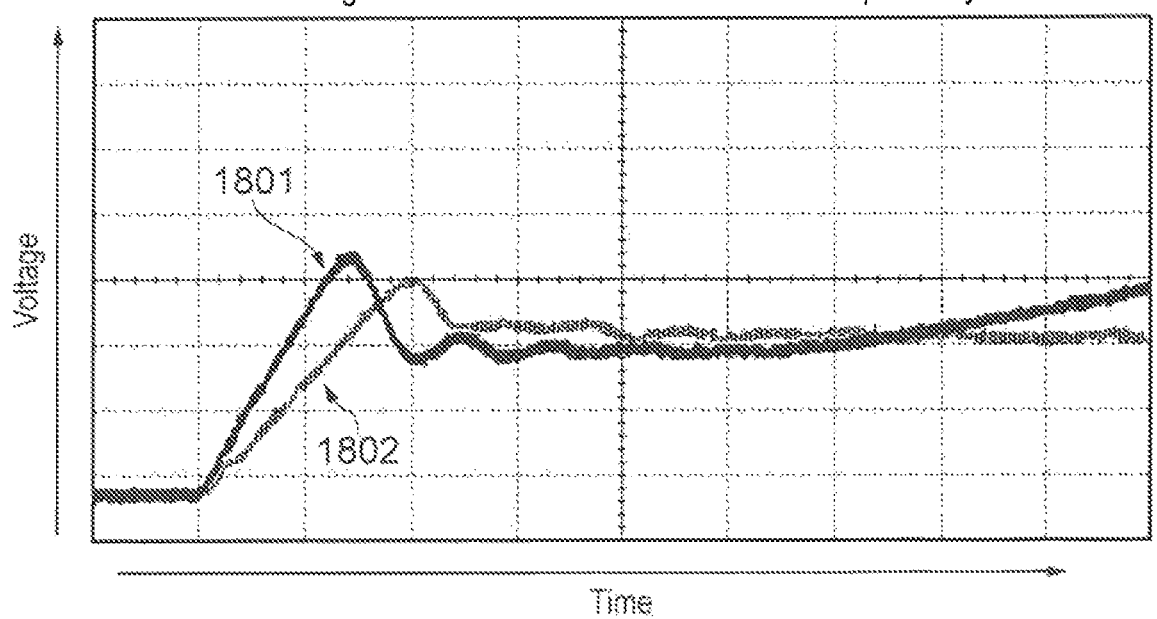
FIG. 18 is a plot of voltage against time for an IGBT before and after power cycle testing, illustrating the change in rate of change of current characteristics.
Figure 19:
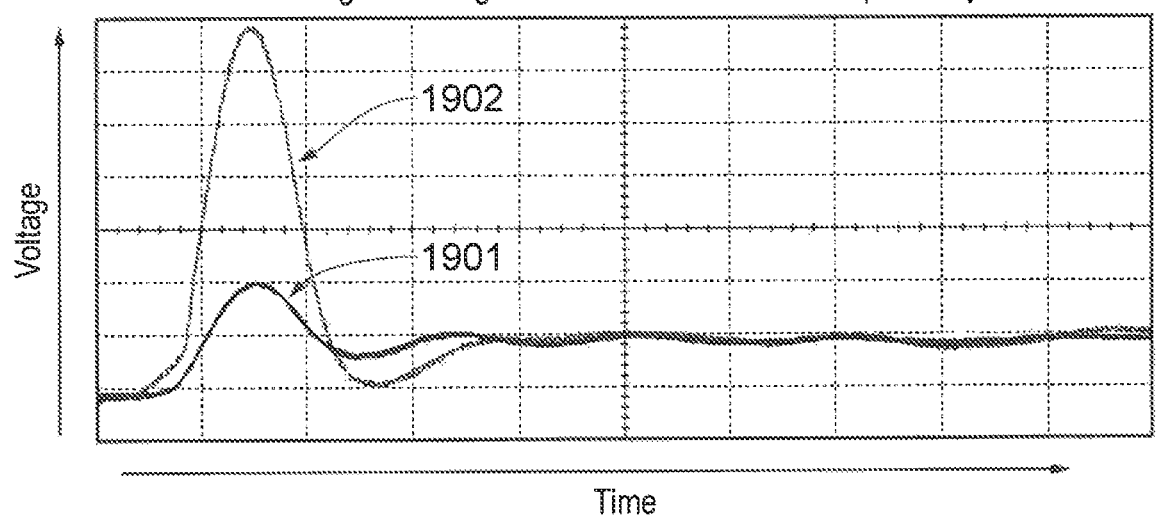
FIG. 19 is a plot of voltage against time for an IGBT before and after power cycle testing, illustrating the change in rate of change of voltage characteristics.

FIGS. 17 to 19 show ageing test results that confirm the suitability of the three parameters for estimating aging.

FIG. 17 is a plot showing the change in gate charge characteristics before 1702 and after 1701 a power cycling test. As can be seen, whilst the gate voltage takes the same switching time to reach the operating voltage both before and after, the overall gate charge has increased after a power cycling tests.

Similarly, FIG. 18 shows that the rate of change of current before 1802 and after 1801 a power cycling test are appreciably different. The results of the test is that the rate of change of current increases after being subjected to a power cycling test.

Finally, FIG. 19 shows that the rate of change of voltage before 1902 and after 1901 a power cycling test are appreciably different. The result of the test is that the rate of change of voltage decreases after being subjected to a power cycling test. From equation (3) it can be seen that the reduction of rate of change of voltage is the effect of decreasing the turn off delay time $t_{doff}$. Asides from the rate of change of voltage, the peak overshoot voltage (highest value before reaching a steady state) also decreases.

From these plots, it can be seen that the rate of change of current $$\frac{di}{dt},$$

reverse recovery current $I_{rr}$, rate of change of voltage $$\frac{dv}{dt},$$

peak overshoot voltage $V_{PO}$ and gate collector capacitance (and therefore gate charge) vary significantly as the device ages.

Figure 20:
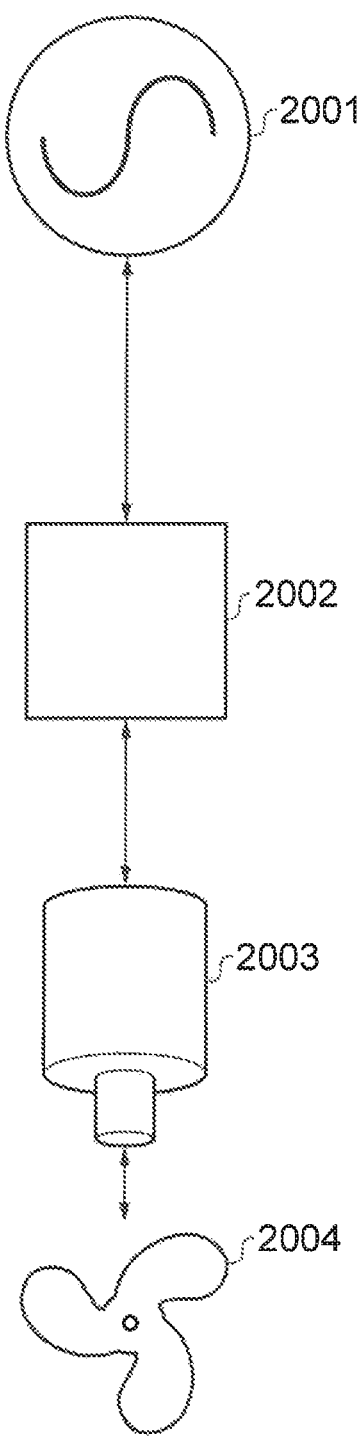
FIG. 20 is a schematic of a propulsion system.

FIG. 20 shows a schematic of an example propulsion system. A power supply 2001, in this example an AC supply, connects to a power device 2002 (e.g. of the type shown in FIG. 1) which includes at least one IGBT. The power device 2002 provides an electrical supply to a propulsion component 2003 e.g. a motor, fuel pump etc. This propulsion component 2003 is functionally linked to a propulsion drive 2004 e.g. a propeller, gas-turbine engine etc.

Advantageously, the invention as described above may provide the following advantages:

The knowledge of the health of the power system and/or devices, e.g. in the form of the RUL, can facilitate early identification of failure conditions. This can enable condition based control and scheduling for maintenance.

The estimation of junction temperature can allow the system to prevent the operation of the power devices beyond their safe operating range. This can stop premature ageing of the devices.

Significant deviations in the average values of the parameters measured can be used to identify weaker devices in the system. This can facilitate early identification of failure conditions.

The use of relatively simple measuring circuits can avoid a need for high bandwidth sensors.

The invention may be applicable in a number of industrial, automobile, and aero electric converter systems to monitor the health and life of the system. The converter systems can be, for example, DC/DC, DC/AC, or AC/DC converters. The converters can use different types of power modules, for example Si, SiC, GaN, etc.

In addition to monitoring the devices and modules, the health monitoring system can be expanded to include other component monitoring capabilities. For example the monitoring of capacitor and filter performance etc.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

All references referred to above are hereby incorporated by reference.

The invention claimed is:

1. A method of monitoring the health of a semiconductor power electronic switch, the method comprising steps of:
   estimating a junction temperature of the switch;
   counting a number of temperature cycles based on the junction temperature;
   when the number of temperature cycles reaches a predetermined number of cycles, measuring one or more parameters selected from the group consisting of: a rate of change of voltage across the switch; a rate of change of current through the switch; a charge present on a gate of the switch; a peak overshoot voltage across the switch; and a peak overshoot or reverse recovery current through the switch; and
   estimating the health of the switch based on the measured one or more parameters, wherein
   estimating the health of the switch includes identifying changes in the measured one or more parameters as a function of temperature cycles, and
   an amount of change exceeding a threshold at higher temperature cycles indicates that the switch is unhealthy.

2. The method of claim 1, wherein estimating the health of the switch includes comparing the measured one or more parameters with a respective pre-defined threshold value.

3. The method of claim 1, wherein
   the step of measuring the one or more parameters and the step of estimating the health of the switch are repeatedly performed at a sampling frequency, and
   the sampling frequency is a function of the estimated health of the switch.

4. The method of claim 1, wherein each of the one or more parameters is measured by a respective embedded measuring circuit of a gate driver of the switch.

5. The method of claim 1,
   wherein estimating the health of the switch includes plotting at least one of the measured one or more parameters with respect to the estimated junction temperature.

6. The method of claim 5, wherein
   at least two of the parameters of the one or more parameters are measured in the step of measuring the one or more parameters,
   one of the at least two measured parameters is used to estimate the junction temperature; and
   the other of the at least two measured parameters is plotted with respect to temperature cycles and results of plotting the parameters are used to estimate the health of the switch.

7. A power conversion system including:
   at least one semiconductor power electronic switch, the switch having a gate driver; and
   a processor connected to the switch,
   wherein the processor is configured to:
      estimate a junction temperature of the switch; and
      count a number of temperature cycles based on the junction temperature, and wherein the gate driver includes one or more parameter measuring modules, and when the number of temperature cycles reaches a predetermined number of cycles, the one or more parameter measuring modules measure one or more respective parameters selected from the group consisting of: a rate of change of voltage across the switch; a rate of change of current through the switch; a charge present on a gate of the switch; a peak overshoot voltage across the switch; and a peak overshoot or reverse recovery current through the switch, wherein the processor is further configured to estimate the health of the switch based on the measured one or more parameters, estimating the health of the switch includes identifying changes in the measured one or more parameters as a function of temperature cycles, and an amount of change exceeding a threshold at higher temperature cycles indicates that the switch is unhealthy.

8. The power conversion system of claim 7, wherein the processor is embedded into the gate driver.

9. The power conversion system of claim 7, wherein the processor is configured to estimate the health of the switch by comparing each of the measured one or more parameters with a respective pre-defined threshold value.

10. The power conversion system of claim 7, wherein the one or more parameter measuring modules repeatedly measure the one or more parameters at a sampling frequency which is a function of the estimated health of the switch, and the processor is further configured to estimate the health of the switch at the sampling frequency.

11. The power conversion system of claim 7, wherein the one or more parameter measuring modules are respective embedded measuring circuits of the gate driver.

12. A propulsion system comprising:

an electric drive, the electric drive being electrically connected to the power conversion system of claim 7.

13. The power conversion system of claim 7, wherein estimating the health of the switch includes plotting at least one of the measured parameters with respect to the estimated junction temperature.

14. The power conversion system of claim 13, wherein the parameter measuring modules measure at least two parameters of the one or more parameters, and wherein the processor is further configured to:

estimate the junction temperature using one of the at least two measured parameters; and estimate the health of the switch using results of plotting the other of the at least two measured parameters with respect to the estimated junction temperature.

15. A gate driver for a semiconductor electronic power switch, the gate driver being suitable to be installed in a power conversion system, the gate driver comprising:

an embedded processor configured to:

estimate a junction temperature of the switch;

count a number of temperature cycles based on the junction temperature;

when the number of temperature cycles reaches a predetermined number of cycles, execute one or more parameter measuring modules for measuring one or more respective parameters selected from the group consisting of: a rate of change of voltage across the switch; a rate of change of current through the switch; a charge present on a gate of the switch; a peak overshoot voltage across the switch; and a peak overshoot or reverse recovery current through the switch; and estimate the health of the switch based upon the measured one or more parameters, wherein estimating the health of the switch includes identifying changes in the measured one or more parameters as a function of temperature cycles, and an amount of change exceeding a threshold at higher temperature cycles indicates that the switch is unhealthy.

* * * * *